(12) United States Patent
Lin et al.

(10) Patent No.: US 11,509,115 B2
(45) Date of Patent: Nov. 22, 2022

(54) ELECTRICALLY PUMPED PHOTONIC-CRYSTAL SURFACE-EMITTING LASER

(71) Applicant: PHOSERTEK CORPORATION, Hsinchu (TW)

(72) Inventors: Chien-Hung Lin, Hsinchu (TW); Bo-Tsun Chou, Hsinchu (TW); Chih-Yuan Weng, New Taipei (TW); Yu-Chen Chen, Taoyuan (TW)

(73) Assignee: Phosertek Corporation, Hsinchu (TW)

( * ) Notice: Subject to any disclaimer, the term of this patent is extended or adjusted under 35 U.S.C. 154(b) by 162 days.

(21) Appl. No.: 17/145,691

(22) Filed: Jan. 11, 2021

(65) Prior Publication Data
US 2021/0344169 A1 Nov. 4, 2021

(30) Foreign Application Priority Data
Apr. 29, 2020 (TW) ................. 109205104

(51) Int. Cl.
| | |
|---|---|
| *H01S 5/11* | (2021.01) |
| *H01S 5/042* | (2006.01) |
| *H01S 5/343* | (2006.01) |
| *H01S 5/18* | (2021.01) |
| *H01S 5/22* | (2006.01) |
| *H01S 5/02* | (2006.01) |

(52) U.S. Cl.
CPC ............ *H01S 5/11* (2021.01); *H01S 5/0206* (2013.01); *H01S 5/04256* (2019.08); *H01S 5/18* (2013.01); *H01S 5/2209* (2013.01); *H01S 5/34346* (2013.01)

(58) Field of Classification Search
CPC .. H01S 5/34346; H01S 5/0206; H01S 5/2209; H01S 5/18; H01S 5/11
USPC ...................................... 372/45.01
See application file for complete search history.

(56) References Cited

U.S. PATENT DOCUMENTS

2007/0201527 A1* 8/2007 Hori ............... H01S 5/18333
372/102
2010/0103972 A1* 4/2010 Saito ................... B82Y 20/00
372/50.1

* cited by examiner

*Primary Examiner* — Tuan N Nguyen
(74) *Attorney, Agent, or Firm* — JCIPRNET

(57) ABSTRACT

An electrically pumped photonic-crystal surface-emitting laser, the epitaxy structure has a first mesa, the first mesa has multiple air holes and forming a photonic crystal structure, the epitaxy structure further has a second mesa, the second mesa and photonic crystal structure is facing the same direction; a first metal electrode arranged on the insulating layer, and covering the photonic crystal structure; a second metal electrode arranged on the second mesa and protruding out of the groove, making the first metal electrode and the second metal electrode face the same direction; and further make the first metal electrode connect to the first connecting metal and make the second metal electrode connect to the second connecting metal for making the photonic crystal structure become flip chip.

6 Claims, 10 Drawing Sheets

ELECTRICALLY PUMPED PHOTONIC-CRYSTAL SURFACE-EMITTING LASER

BACKGROUND OF THE INVENTION

1. Field of the Invention

The invention relates to an electrically pumped photonic-crystal surface-emitting laser, which the first metal electrode and the second metal electrode facing the same direction, and the first metal electrode is connected to the first connecting metal and the second metal electrode is connected to the second connecting metal for making the photonic crystal structure become flip chip.

2. Description of the Related Art

U.S. Pat. No. 10,340,659B1 disclosed an electrically pumped surface-emitting photonic crystal laser, comprising: a substrate having a top surface and a bottom surface; a first cladding layer arranged on said top surface of the substrate; an active layer with a quantum structure arranged on said first cladding layer; a second cladding layer arranged on said active layer; a contact layer arranged on said second cladding layer in a shape of mesa and including a plurality of holes to form a photonic crystal structure, said photonic crystal structure further having a first area on a top surface thereof; an electrical currents confining structure arranged on said photonic crystal structure and on said active layer and including an opening corresponding to said first area on the photonic crystal structure, so as to confine electrical currents within the first area; a transparent conducting layer arranged on said electrical currents confining structure and including a second area on a top surface thereof, covering said first area of the photonic crystal structure and having said second area vertically aligned with said first area; a metal anode arranged on said transparent conducting layer with an aperture aligned with said second area of the transparent conducting layer to avoid blocking the first area; and a metal cathode arranged under said bottom surface of the substrate; whereby the metal anode, the transparent conducting layer, the electrical currents confining structure and the metal cathode are arranged correspondingly for electrically pumping the quantum structure, and then the photonic crystal structure surface-emits laser through the first area, the opening of the electrical currents confining structure and the second area of the transparent conducting layer to the aperture of the metal anode.

The metal anode and the metal cathode need to be wire bonding, a common bonding technique, however, it will produce a strong parasitic inductance effect during signal transmission and causing the signal distortion, and since the transparent conducting layer is made of indium tin oxide (ITO) which will absorb, refract and scattering the light, so the laser emitting effect is reduced. Moreover, since the conventional laser structure has bad heat dissipation, it will easily get degraded under high current operation.

SUMMARY OF THE INVENTION

It is a primary objective of the present invention is to provide an electrically pumped photonic-crystal surface-emitting laser, which the first metal electrode and the second metal electrode facing the same direction, and the first metal electrode is connected to the first connecting metal and the second metal electrode is connected to the second connecting metal, so as to skip the wire bonding process and avoid the signal distortion problem.

Another objective of the present invention is to provide an electrically pumped photonic-crystal surface-emitting laser, which the first metal electrode and the second metal electrode facing the same direction, and the first metal electrode is connected to the first connecting metal and the second metal electrode is connected to the second connecting metal, so as to omit the transparent conducting layer for avoid the light absorb, refract and scattering and further improve the efficiency of laser emitting.

Another objective of the present invention is to provide an electrically pumped photonic-crystal surface-emitting laser, which the first metal electrode and the second metal electrode facing the same direction, and the first metal electrode is connected to the first connecting metal and the second metal electrode is connected to the second connecting metal, so as to replace conventional laser structure and further improve the heat dispassion efficiency.

In order to achieve the above objectives, the electrically pumped photonic-crystal surface-emitting laser, includes a first substrate having a first surface and a second surface; a first cladding layer arranged on the first surface of the first substrate; a first separate confinement heterostructure arranged on the first cladding layer; an active layer arranged on the first separate confinement heterostructure and having a quantum structure; a second separate confinement heterostructure arranged on the active layer; a second cladding layer arranged on the second separate confinement heterostructure; a contact layer arranged on said second cladding layer making the first substrate, the first cladding layer, the first separate confinement heterostructure, the active layer, the second separate confinement heterostructure and the second cladding layer form an epitaxy structure, the epitaxy structure has a first mesa, the first mesa has multiple air holes and forming a photonic crystal structure, the epitaxy structure further has a second mesa, the second mesa and photonic crystal structure is facing the same direction; an insulating layer arranged on the photonic crystal structure and the second mesa, having an aperture and a groove, the aperture is corresponded to the photonic crystal structure and the groove is corresponded to the second mesa; a first metal electrode arranged on the insulating layer, and covering the photonic crystal structure; a second metal electrode arranged on the second mesa and protruding out of the groove, making the first metal electrode and the second metal electrode face the same direction; and a second substrate having a third face and a fourth surface, on the third face of the second substrate has a first connecting metal and a second connecting metal, then covering the first substrate on the second substrate, and further make the first metal electrode connect to the first connecting metal and make the second metal electrode connect to the second connecting metal for making the photonic crystal structure become flip chip; whereby the first metal electrode, the second metal electrode, the first connecting metal and the second connecting metal excite the quantum structure, let the laser of quantum structure reflect at the first metal electrode, and then surface emitting laser from the photonic crystal structure out of the second face of the first substrate.

Also, the second cladding layer has a thickness between 10 to 3000 nm.

Also, the air holes are arranged in 2-dimension.

Also, the quantum structure includes at least a layer of quantum well or a layer of quantum dots or a layer of quantum wire.

Also, the material of the layer of quantum well, the layer of quantum dots and the layer of the quantum wire is composed of: gallium arsenide (GaAs), gallium Phosphide (GaP), gallium nitride (GaN), indium arsenide (InAs), indium phosphide (InP), indium nitride (InN), indium gallium arsenide (InGaAs), indium gallium phosphide (InGaP), indium gallium nitride (InGaN), aluminium gallium arsenide (AlGaAs), aluminum gallium indium arsenide (AlGaInAs), aluminum gallium indium phosphide (AlGaInP), indium gallium aluminium nitride (InGaAlN), gallium indium arsenide phosphide (GaInAsP), indium antimonide (InSb), gallium antimonide (GaSb), aluminium antimonide (AlSb), gallium arsenide antimonide (GaAsSb), indium arsenide antimonide (InAsSb), aluminum arsenide antimonide (AlAsSb), gallium indium antimonide (GaInSb), aluminum gallium antimonide (AlGaSb), indium gallium arsenide antimonide (InGaAsSb) and aluminum gallium arsenide antimonide (AlGaAsSb).

Also, the material of the substrate is composed of: gallium nitride (GaN), allium arsenide (GaAs), indium phosphide (InP) and gallium antimonide (GaSb).

With structures disclosed above, the present invention has the first metal electrode and the second metal electrode facing the same direction, and the first metal electrode is connected to the first connecting metal and the second metal electrode is connected to the second connecting metal, so the present invention does not require the transparent conducting layer and can avoid the problem of light the light absorb, refract and scattering, also, the present invention can improve the heat dispassion efficiency and skip the wire bonding process, and further avoid the parasitic inductance.

DETAILED DESCRIPTION OF THE PREFERRED EMBODIMENT

Figure 1A:
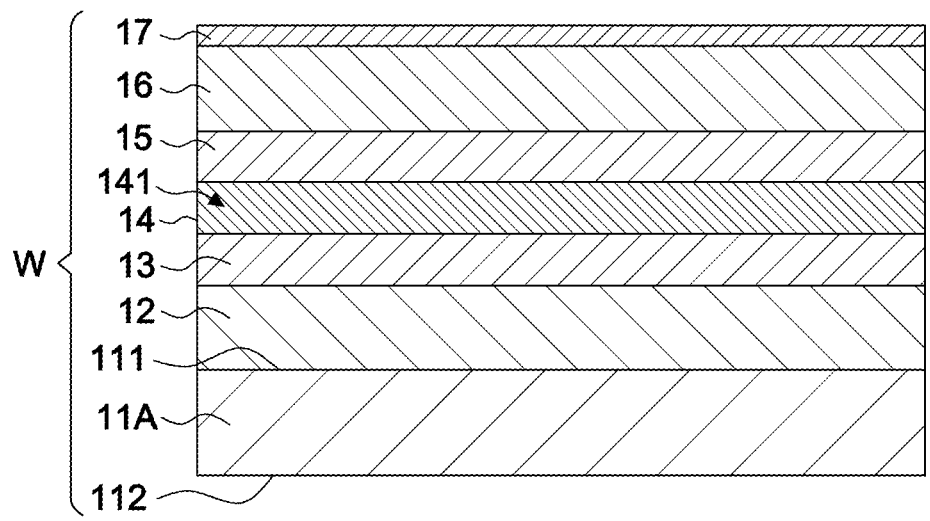
FIG. 1A is a schematic diagram of an epitaxy structure of the present invention.

Referring to FIGS. 1A-1M, the present invention is an electrically pumped photonic-crystal surface-emitting laser, comprising: a first substrate 11A having a first surface 111 and a second surface 112, in a preferred embodiment, the substrate 11A can be composed of gallium nitride (GaN), allium arsenide (GaAs), indium phosphide (InP) and gallium antimonide (GaSb), but the present invention is not limited to such application.

A first cladding layer 12 arranged on the first surface 111 of the first substrate 11A; in a preferred embodiment, the first cladding layer 12 can be composed of aluminium gallium arsenide (AlGaAs), allium arsenide (GaAs), aluminium gallium nitride (AlGaN), aluminum gallium indium arsenide (AlGaInAs), aluminum gallium indium phosphide (AlGaInP), aluminum gallium antimonide (AlGaSb), gallium arsenide antimonide (GaAsSb), aluminum gallium arsenide antimonide (AlGaAsSb) or the combination thereof, but the present invention is not limited to such application.

A first separate confinement heterostructure 13 arranged on the first cladding layer 12; in a preferred embodiment, the first separate confinement heterostructure 13 can be composed of aluminium gallium arsenide (AlGaAs), allium arsenide (GaAs), aluminium gallium nitride (AlGaN), aluminum gallium indium arsenide (AlGaInAs), aluminum gallium indium phosphide (AlGaInP), aluminum gallium antimonide (AlGaSb), gallium arsenide antimonide (GaAsSb), aluminum gallium arsenide antimonide (AlGaAsSb) or the combination thereof; the thickness of the first separate confinement heterostructure 13 is 130 nm, but the present invention is not limited to such application.

An active layer 14 arranged on the first separate confinement heterostructure 13 and having a quantum structure 141; in a preferred embodiment, the quantum structure includes at least a layer of quantum well or a layer of quantum dots or a layer of quantum wire; the quantum well, the quantum dot and the quantum wire can be composed of gallium arsenide (GaAs), gallium Phosphide (GaP), gallium nitride (GaN), indium arsenide (InAs), indium phosphide (InP), indium nitride (InN), indium gallium arsenide (InGaAs), indium gallium phosphide (InGaP), indium gallium nitride (InGaN), aluminium gallium arsenide (AlGaAs), aluminum gallium indium arsenide (AlGaInAs), aluminum gallium indium phosphide (AlGaInP), indium gallium aluminium nitride (InGaAlN), gallium indium arsenide phosphide (GaInAsP), indium antimonide (InSb), gallium antimonide (GaSb), aluminium antimonide (AlSb), gallium arsenide antimonide (GaAsSb), indium arsenide antimonide (InAsSb), aluminum arsenide antimonide (AlAsSb), gallium indium antimonide (GaInSb), aluminum gallium antimonide (AlGaSb), indium gallium arsenide antimonide (InGaAsSb) and aluminum gallium arsenide antimonide (AlGaAsSb), but the present invention is not limited to such application.

A second separate confinement heterostructure 15 arranged on the active layer 14; in a preferred embodiment, the second separate confinement heterostructure 15 can be composed of aluminium gallium arsenide (AlGaAs), allium arsenide (GaAs), aluminium gallium nitride (AlGaN), aluminum gallium indium arsenide (AlGaInAs), aluminum gallium indium phosphide (AlGaInP), aluminum gallium antimonide (AlGaSb), gallium arsenide antimonide (GaAsSb), aluminum gallium arsenide antimonide (AlGaAsSb) or the combination thereof; the thickness of the second separate confinement heterostructure 15 is 105 nm; but the present invention is not limited to such application. Therefore, the first separate confinement heterostructure 13 and the second separate confinement heterostructure 15 achieve the limitations of carriers and light fields.

A second cladding layer 16 arranged on the second separate confinement heterostructure 15; in a preferred embodiment, the thickness of the second cladding layer 16 is between 10-3000 nm, and the second cladding layer 16 can be composed of aluminium gallium arsenide (AlGaAs), allium arsenide (GaAs), aluminium gallium nitride (AlGaN), aluminum gallium indium arsenide (AlGaInAs), aluminum gallium indium phosphide (AlGaInP), aluminum gallium antimonide (AlGaSb), gallium arsenide antimonide (GaAsSb), aluminum gallium arsenide antimonide (AlGaAsSb) or the combination thereof; but the present invention is not limited to such application.

A contact layer 17 arranged on said second cladding layer 16; in a preferred embodiment, the contact layer 17 can be composed of gallium nitride (GaN), allium arsenide (GaAs), indium phosphide (InP) and gallium antimonide (GaSb) or the combination thereof; but the present invention is not limited to such application.

Figure 1B:
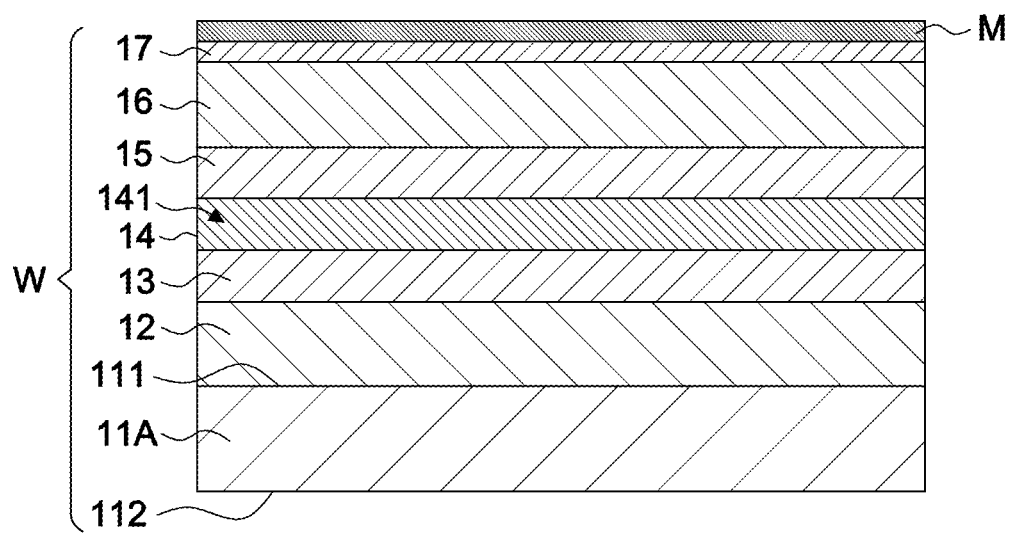
FIG. 1B is a schematic diagram illustrating fabrication of a hard mask of the present invention.

Referring to FIG. 1A, the first substrate 11A, the first cladding layer 12, the first separate confinement heterostructure 13, the active layer 14, the second separate confinement heterostructure 15 and the second cladding layer 16 fabricated an epitaxy structure W, and the number of the layer of the epitaxy structure W is not limited.

with reference to FIG. 1B, the hard mask M is fabricated by having silicon nitride (SiNx) deposited on the epitaxy structure W, but the present invention is not limited to such application.

Figure 1C:
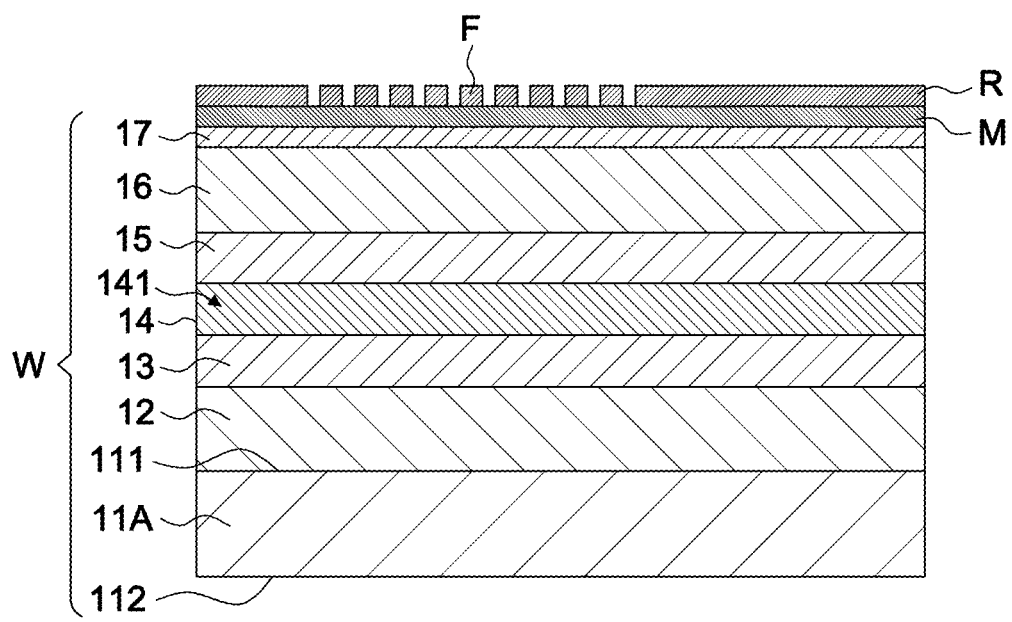
FIG. 1C is a schematic diagram illustrating a geometric pattern formed on the hard mask of the present invention.

Referring to FIG. 1C, a photonic crystal pattern F is formed by having positive photoresist R applied on the epitaxy structure W within a square area of 290 μm; but the present invention is not limited to such application.

Figure 1D:
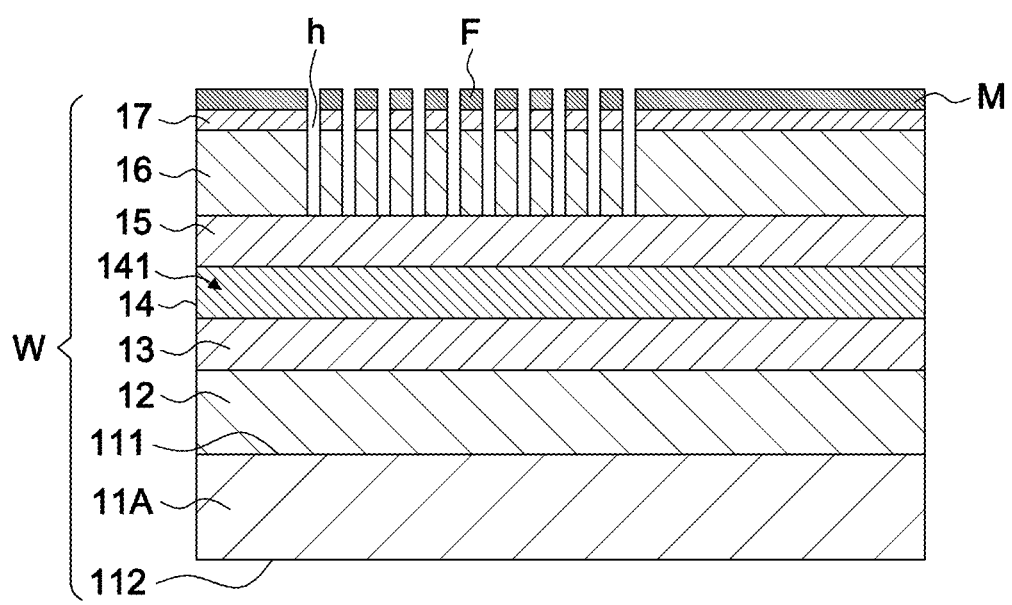
FIG. 1D is a schematic diagram illustrating imprint of the geometric pattern.

FIG. 1D illustrated the imprint of the photonic crystal pattern F. The photonic crystal pattern F is imprinted onto the hard mask M and then the positive photoresist R is removed; then the photonic crystal pattern F is further imprinted onto the epitaxy structure W. Since a waveguide pattern of the quantum structure 141 mostly restricts the laser within the active layer 14, deep etching is required for better bonding. When the depth of etching is greater than 500 nm, the bonding efficiency of the photonic crystals is better, but the present invention is not limited to such application.

Figure 1E:
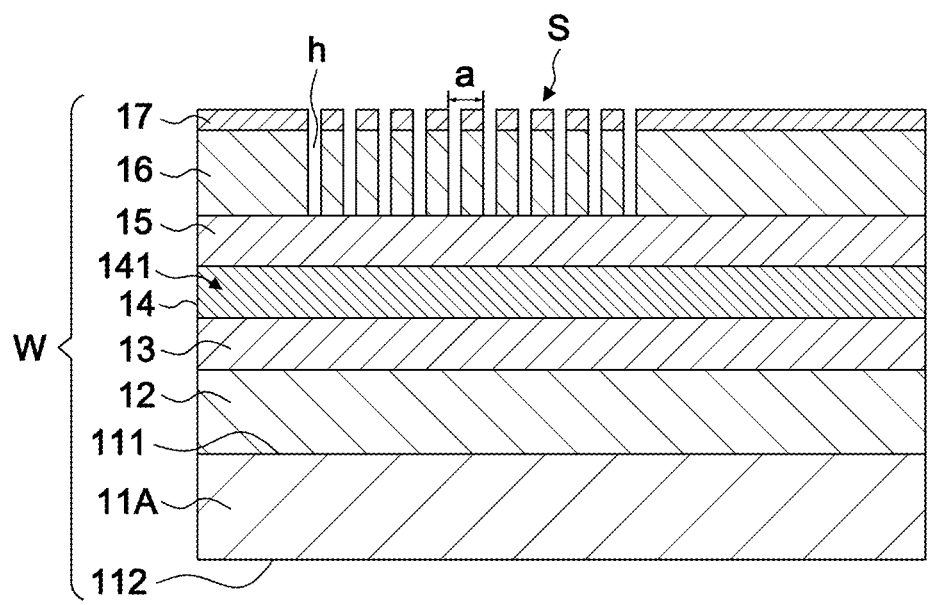
FIG. 1E is a schematic diagram illustrating the hard mask being removed.

FIG. 1E further illustrated removal of the hard mask M, and the second cladding layer 16 has a plurality of air holes h to form the photonic crystal structure S, in preferred embodiment, the periodicity a of the photonic crystal structure S is 385 nm, 388 nm, 390 nm, 393 nm or 395 nm, but the present invention is not limited to such application. Additionally, the air holes h are arranged in a column shape with a depth of 520-540 nm and a diameter of 130-140 nm; and the air holes h are arranged in 2-dimension, but the present invention is not limited to such application.

Figure 1F:
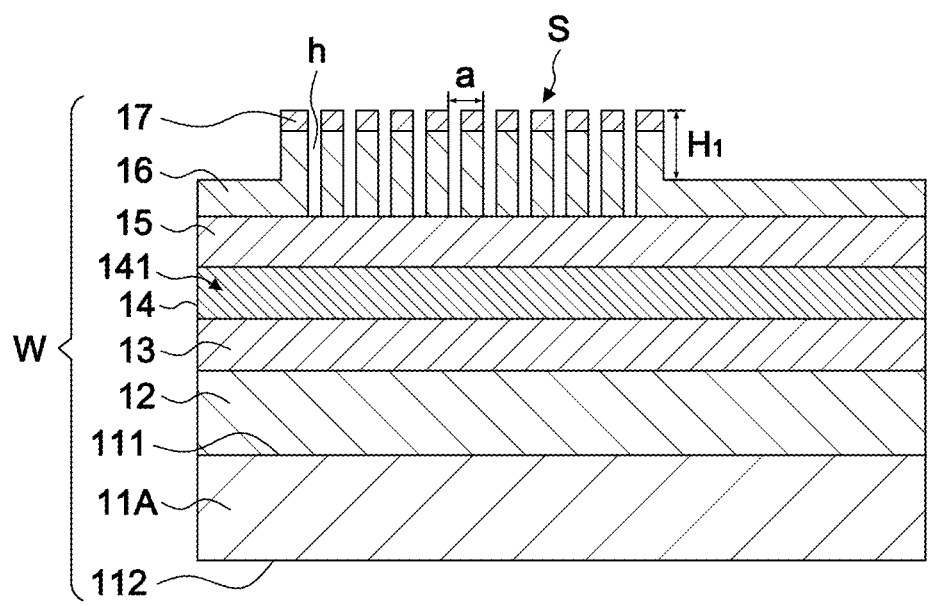
FIG. 1F is a schematic diagram illustrating a first mesa formed by etching.

With reference to FIG. 1F, a square mesa of 310 μm with an etching depth of 450 nm and the first mesa $H_1$ is etched on the epitaxy structure W. The purpose of the first mesa $H_1$ is to limit the laser beams within the photonic crystals and reduce leakage currents, in preferred embodiment, the second cladding layer 16 and the contact layer 17 form the first mesa $H_1$, but the present invention is not limited to such application.

Figure 1G:
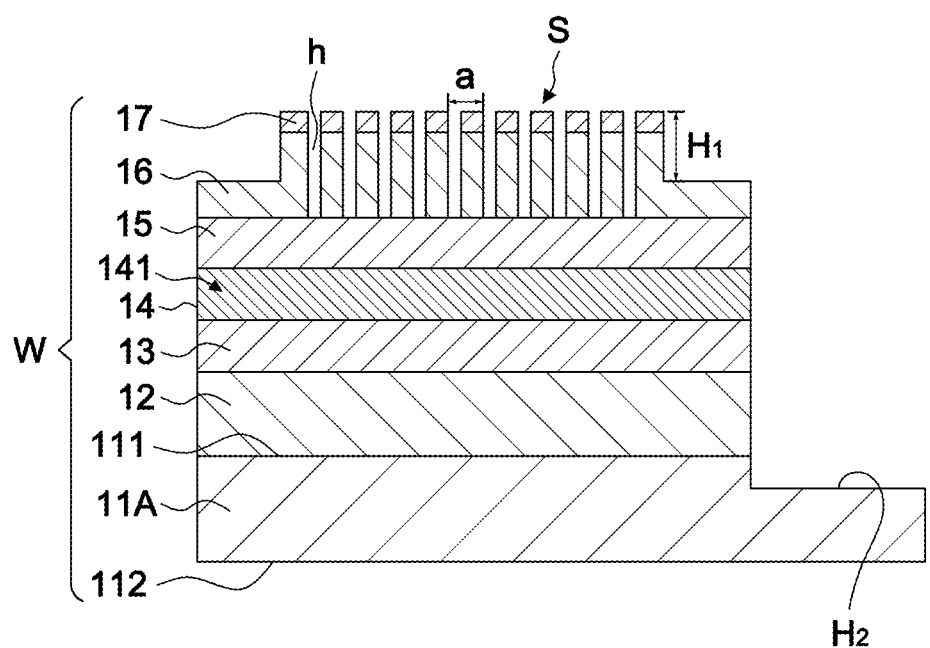
FIG. 1G is a schematic diagram illustrating a second mesa formed by etching.
Figure 1H:
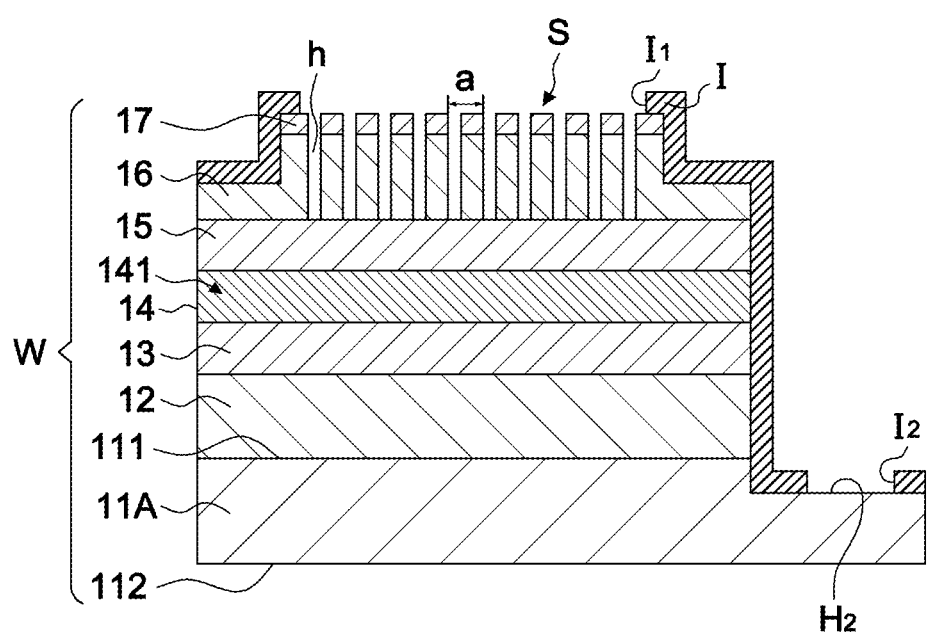
FIG. 1H is a schematic diagram illustrating fabrication of an insulating layer of the present invention.

With reference to FIG. 1G, the second mesa $H_2$ is etched on the epitaxy structure W, and the second mesa $H_2$ is facing the same direction as the photonic crystal structure S, in preferred embodiment, the second mesa $H_2$ is etched to the first substrate 11A, but the present invention is not limited to such application.

FIG. 1G illustrated the fabrication of an insulating layer I. Since photonic crystals have infinite periodicity, theoretically, there would not be loss on boundaries; however, the photonic crystals for application actually have finite periodicity, so there would be loss on boundaries during operation. Therefore, to reduce the loss on boundaries during operation, an area of the photonic crystals is arranged to be greater than a gain area of the device; additionally, the photonic crystals having an area 2-3 times greater than a gain area of the device can still produce laser beams successfully. Consequently, photolithography is applied to the present invention to fabricate a geometric pattern of an aperture in the middle of the of the photonic crystal structure 15 and geometric pattern of a groove on the second mesa $H_2$; then SiNx is deposited with a thickness of 120 nm. After removing unnecessary SiNx by lift-off process, the insulating layer I is fabricated on the photonic crystal structure S and the second mesa $H_2$, and having an aperture $I_1$ and a groove $I_2$, and the aperture $I_1$ is fabricated correspondingly to the photonic crystal structure S and the groove $I_2$ is fabricated correspondingly the second mesa $H_2$ to confine electrical currents within the first areas $A_1$ and to enable the laser pattern to exist within the photonic crystal structure S similar to one with infinite periodicity. In this embodiment, the insulating layer I is made of a material selected from a group consisting of SiNx, silicon oxide (SiOx) and polyimide, but the present invention is not limited to such application.

Figure 1I:
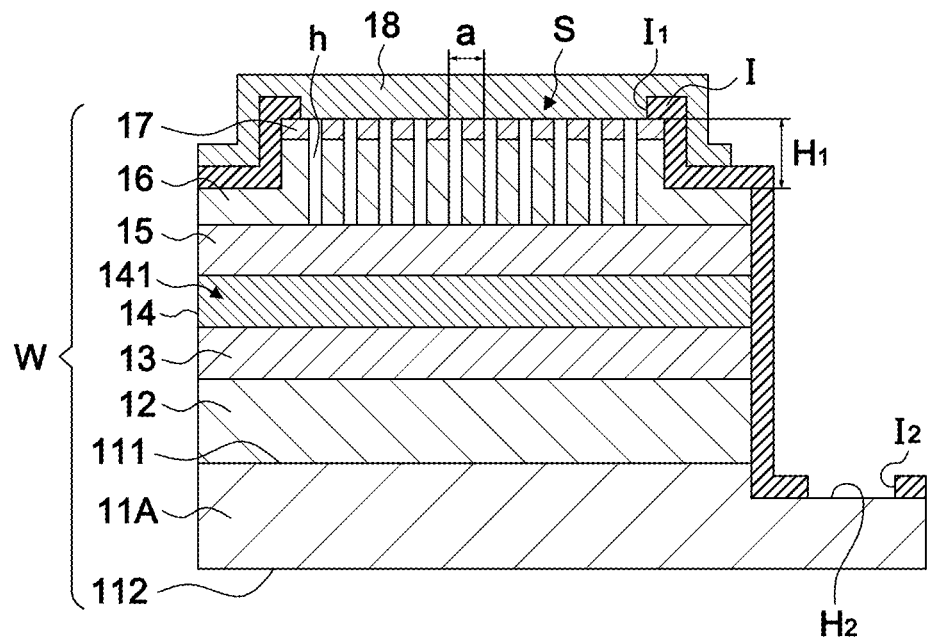
FIG. 1I is a schematic diagram illustrating deposition of a first metal electrode of the present invention.

FIG. 1I illustrated the deposition of the first metal electrode 18 and then deposit titanium (Ti) and gold (Au) to make the first metal electrode 18 be arranged on the insulating layer I and covered on the photonic crystal structure S, but the present invention is not limited to such application.

Figure 1J:
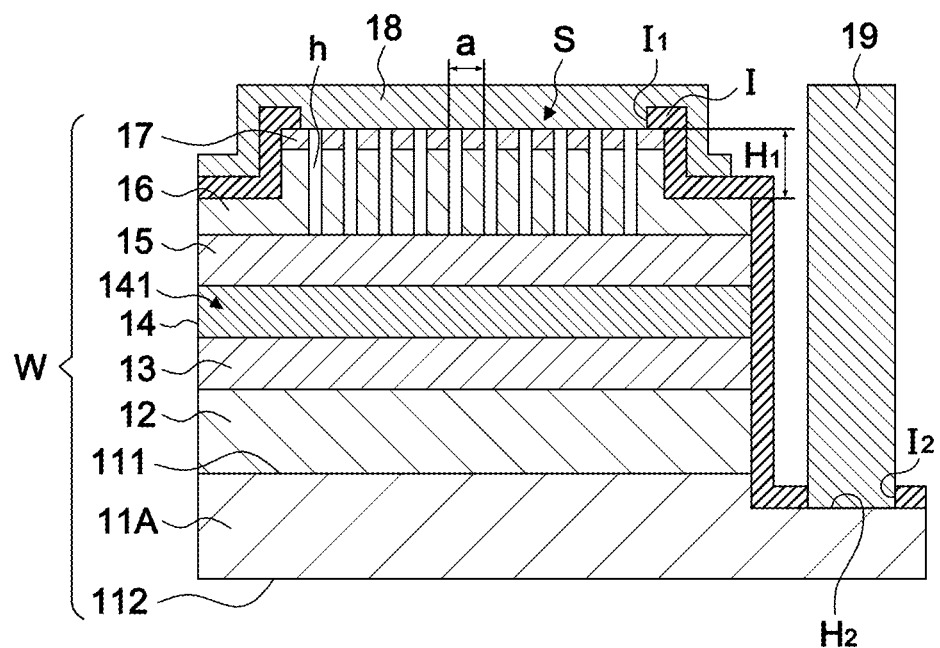
FIG. 1J is a schematic diagram illustrating deposition of a second metal electrode of the present invention.

FIG. 1J illustrated the deposition of nickel (Ni), germanium (Ge) and gold (Au) to fabricate the second metal electrode 19 on the first mesa $H_1$ and be protruded out of the groove $I_2$, making the first metal electrode 18 and the second metal electrode 19 face the same direction, but the present invention is not limited to such application.

Figure 1K:
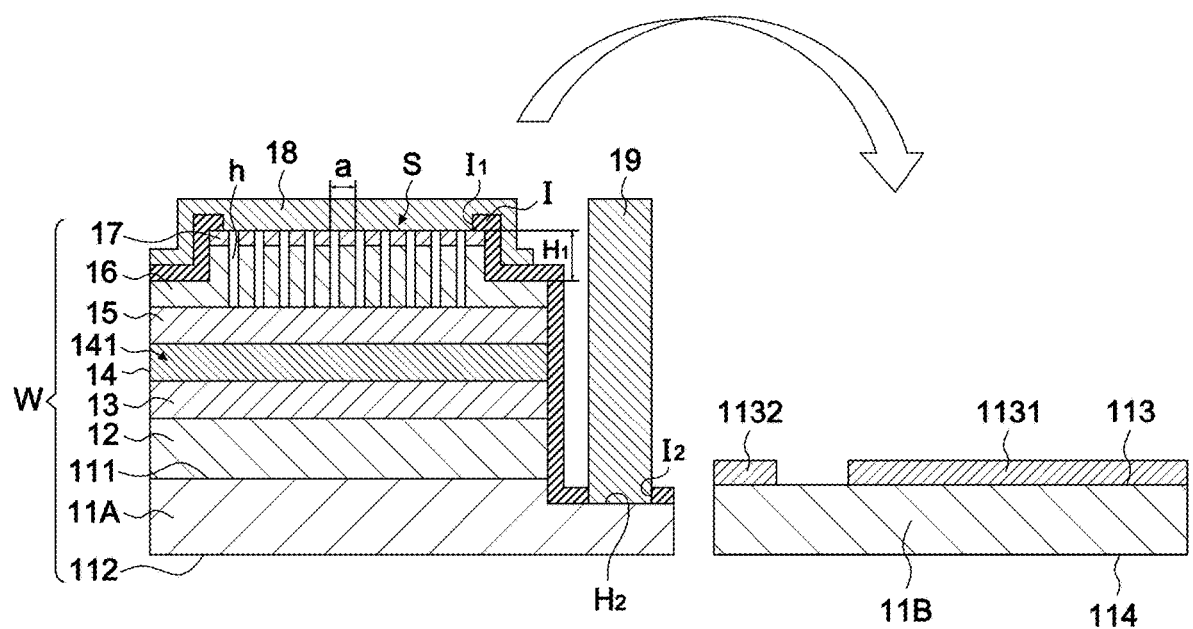
FIG. 1K is a schematic diagram illustrating the flip chip process of the photonic crystal structure of the present invention.
Figure 1L:
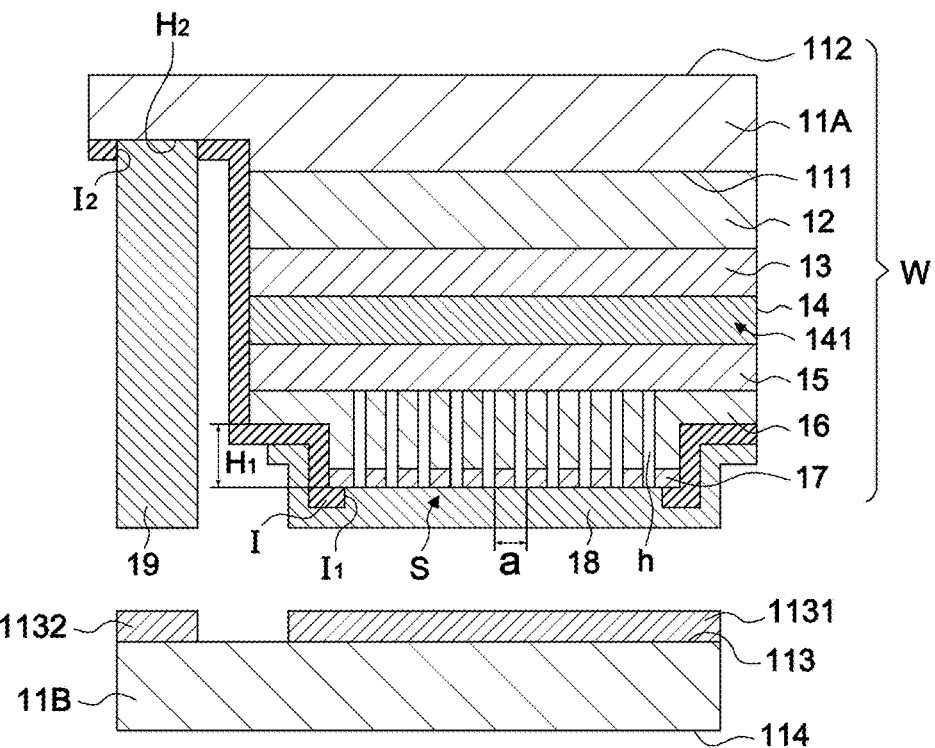
FIG. 1L is a schematic diagram illustrating the first metal electrode connecting to the first connecting metal and the second metal electrode connecting to the second connecting metal.
Figure 1M:
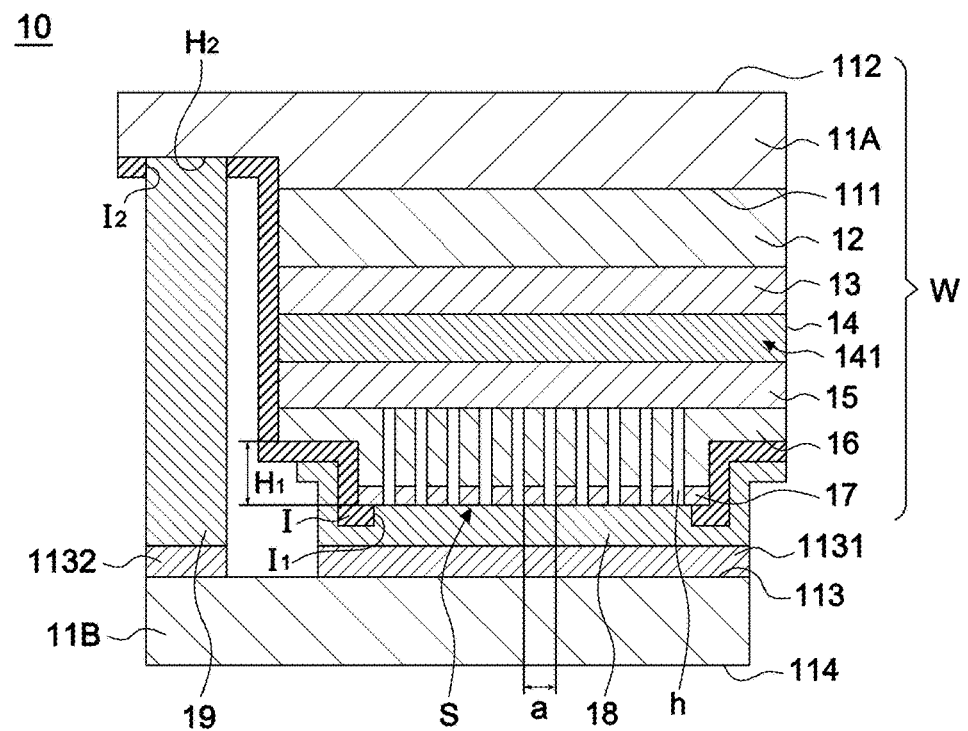
FIG. 1M is a schematic diagram illustrating finishing the flip chip process of the photonic crystal structure of the present invention.

Referring to FIGS. 1K-1M, wherein a second substrate 11B having a third face 113 and a fourth surface 114, on the third face 113 of the second substrate 11B has a first connecting metal 1131 and a second connecting metal 1132, then covering the first substrate 11A on the second substrate 11B, and further make the first metal electrode 18 connect to the first connecting metal 1131 and make the second metal electrode 19 connect to the second connecting metal 1132 for making the photonic crystal structure S become flip chip; Then the electrically pumped surface-emitting photonic crystal laser 10 is fabricated after rapid thermal annealing process. Still, the present invention is not limited to such application.

Moreover, the structure above the active layer 14 is a p-type semiconductor with beryllium dopant at an amount of $10^{18}$ cm$^{-3}$ and the structure under the active layer 14 is an n-type semiconductor with silicon and tellurium dopant at an amount of $10^{18}$ cm$^{-3}$, and the heavily doped area is in amount of $10^{19}$ cm$^{-3}$. The materials fabricating the first substrate 11A, the first cladding layer 12, the first separate confinement heterostructure 13, the second separate confinement heterostructure 15, the second cladding layer 16, the contact layer 17 and the second substrate 11B also allow a wavelength of the laser to include blue and infrared lights.

Figure 2A:
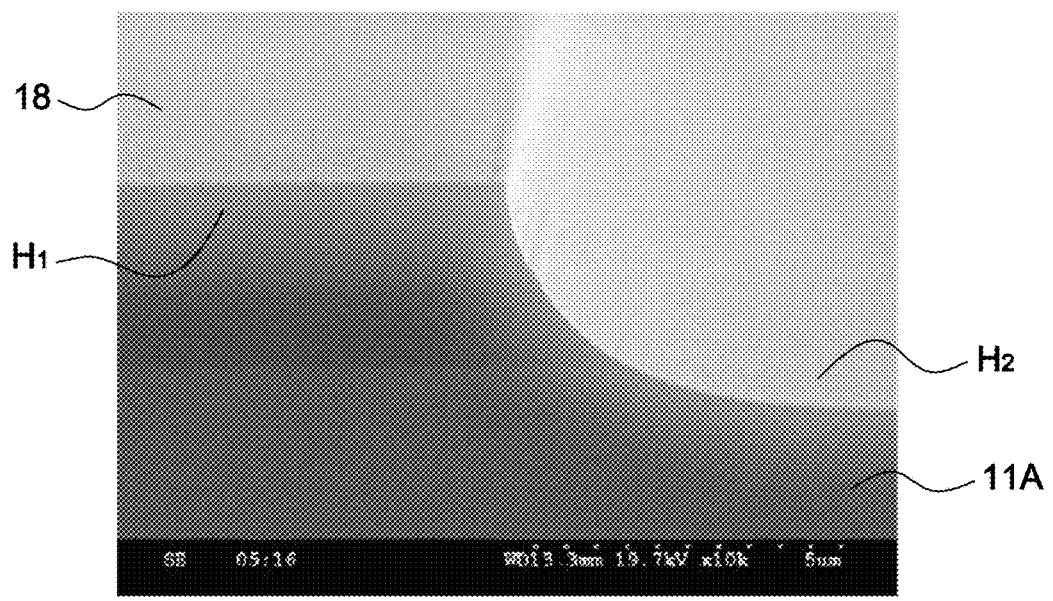
FIG. 2A is a perspective view of first substrate, first mesa, second mesa and first metal electrode of the present invention under an electron microscope.
Figure 2B:
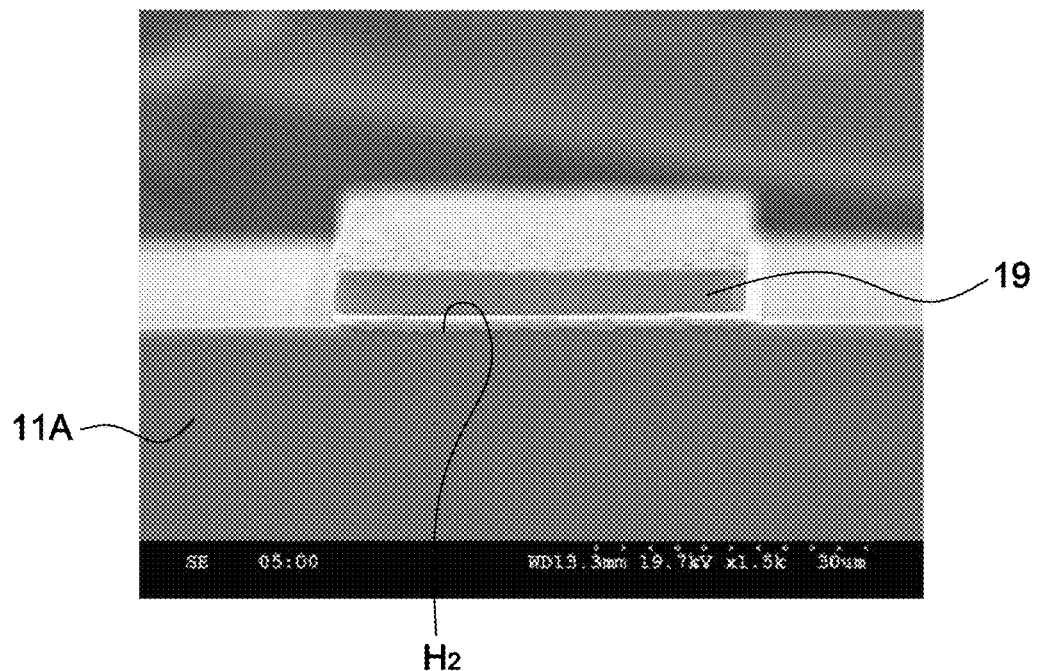
FIG. 2B is a perspective view of first substrate, second mesa and second metal electrode of the present invention under an electron microscope.
Figure 2C:
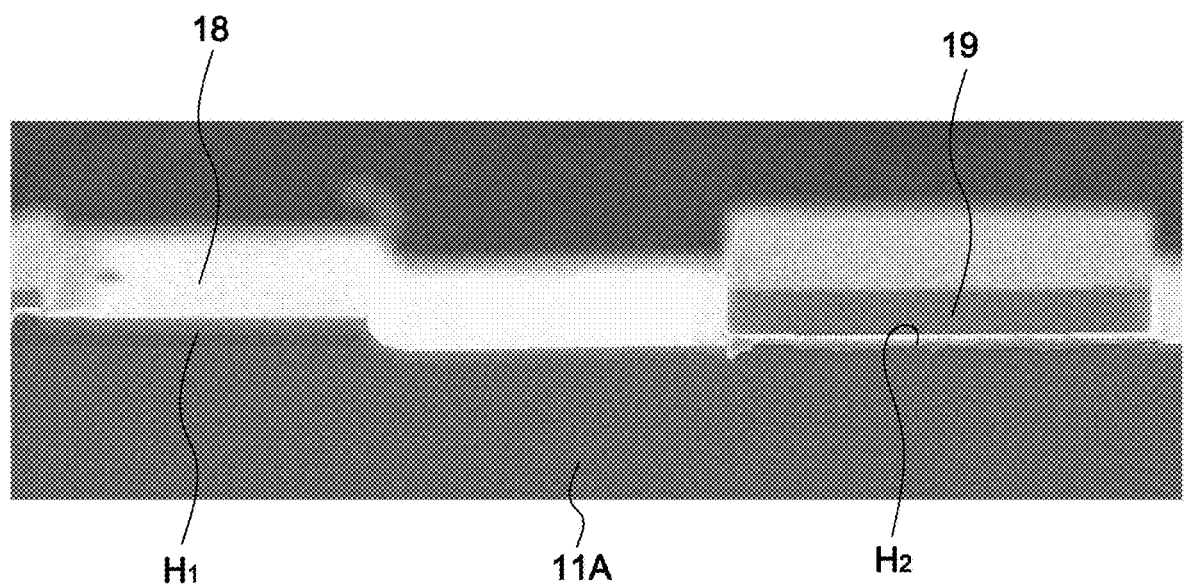
FIG. 2C is a perspective view of first substrate, first mesa, second mesa, first metal electrode and second metal electrode of the present invention under an electron microscope.

Moreover, referring to FIG. 2A, showing a perspective view of, the first mesa $H_1$ and the second mesa $H_2$ and first metal electrode 18 of the present invention under an electron microscope, the first mesa $H_1$ and the second mesa $H_2$ are fabricated by wet or dry etch, the second mesa $H_2$ is etched curve while using wet etch and is vertical while using dry etch. As FIG. 2B showing, it presents the first mesa $H_1$, the second mesa $H_2$ and the second metal electrode 19, the thickness of the second metal electrode 19 can be increased. As FIG. 2C showing, it presents the first substrate 11A, the first mesa $H_1$, the second mesa $H_2$, the first metal electrode 18 and the second metal electrode 19.

Also, With structures disclosed above, the present invention has the quantum structure 141 as the gain media to successfully fabricate the electrically pumped surface-emitting photonic crystal laser operable at room temperature. The periodicity a of the photonic crystal structure S is 385 nm, 388 nm, 390 nm, 393 nm or 395 nm, a wavelength of emitted laser beam is around 1.3 μm; in other words, the wavelength of emitted laser beam is variable since the wavelength becomes longer as the periodicity a of the photonic crystal structure S gets longer. On the other hand, the present invention does not require complex techniques of wafer fusion bonding and epitaxial regrowth for fabrication; instead, it has the epitaxy structure W etched from the top for fabrication of the photonic crystal structure S, so as to enable laser beams to be emitted from a front surface of the epitaxy structure W and to bring features of surface-emission and narrow divergence angle.

Figure 3:
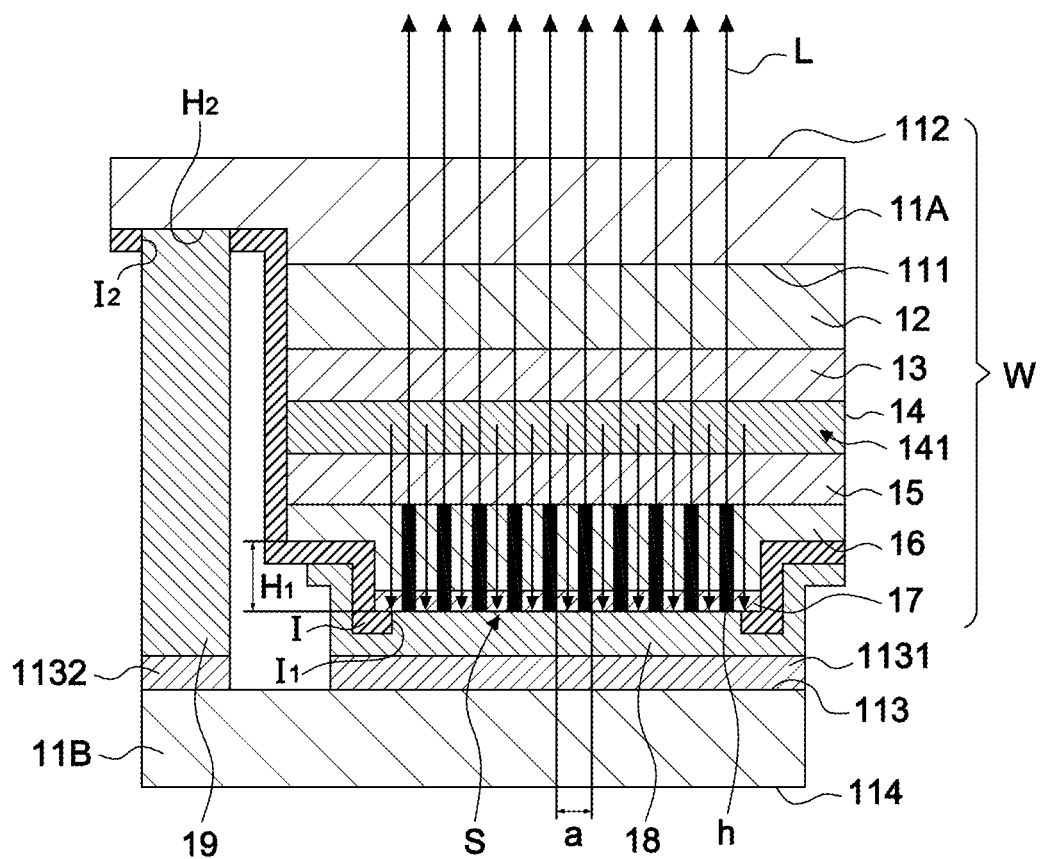
FIG. 3 is an application example of the present invention.

As FIG. 3 showing, with the feature disclosed above, both embodiments have the first metal electrode 18, the second metal electrode 19, the first connecting metal 1131 and the second connecting metal 1132 operated to reduce impedance and electrically pump the quantum structure 141; then the quantum structure 141 emits laser beams L to the first metal electrode 18, then reflect a surface laser L to the photonic crystal structure S, the second separate confinement heterostructure 15, the active layer 14, the first cladding layer 12, the first separate confinement heterostructure 13 and the second surface 112 of the first substrate 11A, so as to achieve emitting laser form the back surface of the epitaxy structure W.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electrically pumped photonic-crystal surface-emitting laser, comprising:
    a first substrate having a first surface and a second surface;
    a first cladding layer arranged on the first surface of the first substrate;
    a first separate confinement heterostructure arranged on the first cladding layer;
    an active layer arranged on the first separate confinement heterostructure and having a quantum structure;
    a second separate confinement heterostructure arranged on the active layer;
    a second cladding layer arranged on the second separate confinement hetero structure;
    a contact layer arranged on the second cladding layer making the first substrate, the first cladding layer, the first separate confinement heterostructure, the active layer, the second separate confinement heterostructure and the second cladding layer form an epitaxy structure, the epitaxy structure has a first mesa with multiple air holes and forming a photonic crystal structure, the epitaxy structure further has a second mesa, the second mesa and photonic crystal structure is facing the same direction;
    an insulating layer arranged on the photonic crystal structure and the second mesa, having an aperture and a groove, the aperture is corresponded to the photonic crystal structure and the groove is corresponded to the second mesa;
    a first metal electrode arranged on the insulating layer, and covering the photonic crystal structure;
    a second metal electrode arranged on the second mesa and protruding out of the groove, making the first metal electrode and the second metal electrode face the same direction; and
    a second substrate having a third face and a fourth surface, on the third face of the second substrate has a first connecting metal and a second connecting metal, then covering the first substrate on the second substrate, and further make the first metal electrode connect to the first connecting metal and make the second metal electrode connect to the second connecting metal for making the photonic crystal structure become flip chip; whereby the first metal electrode, the second metal electrode, the first connecting metal and the second connecting metal excite the quantum structure, let the laser of quantum structure reflect at the first metal electrode, and then surface emitting laser from the photonic crystal structure out of the second face of the first substrate.

2. The electrically pumped photonic-crystal surface-emitting laser, as claimed in claim 1, wherein the second cladding layer has a thickness between 10 to 3000 nm.

3. The electrically pumped photonic-crystal surface-emitting laser, as claimed in claim 1, wherein the air holes are arranged in 2-dimension.

4. The electrically pumped photonic-crystal surface-emitting laser, as claimed in claim 1, wherein the quantum structure includes at least a layer of quantum well or a layer of quantum dots or a layer of quantum wire.

5. The electrically pumped photonic-crystal surface-emitting laser, as claimed in claim 4, wherein the material of the layer of quantum well, the layer of quantum dots and the layer of the quantum wire is composed of: gallium arsenide (GaAs), gallium Phosphide (GaP), gallium nitride (GaN), indium arsenide (InAs), indium phosphide (InP), indium nitride (InN), indium gallium arsenide (InGaAs), indium gallium phosphide (InGaP), indium gallium nitride (InGaN), aluminium gallium arsenide (AlGaAs), aluminum gallium indium arsenide (AlGaInAs), aluminum gallium indium phosphide (AlGaInP), indium gallium aluminium nitride (InGaAlN), gallium indium arsenide phosphide (GaInAsP), indium antimonide (InSb), gallium antimonide (GaSb), aluminium antimonide (AlSb), gallium arsenide antimonide (GaAsSb), indium arsenide antimonide (InAsSb), aluminum arsenide antimonide (AlAsSb), gallium indium antimonide (GaInSb), aluminum gallium antimonide (AlGaSb), indium gallium arsenide antimonide (InGaAsSb) and aluminum gallium arsenide antimonide (AlGaAsSb).

6. The electrically pumped photonic-crystal surface-emitting laser, as claimed in claim 1, wherein the material of the substrate is composed of: gallium nitride (GaN), allium arsenide (GaAs), indium phosphide (InP) and gallium antimonide (GaSb).

\* \* \* \* \*